United States Patent [19]

Zeigler et al.

[11] Patent Number: 5,759,961
[45] Date of Patent: Jun. 2, 1998

[54] SUPERCONDUCTOR FIBER ELONGATION WITH A HEATED INJECTED GAS

[75] Inventors: Douglas D. Zeigler, Atwater; Barry L. Conrad, Alliance; Richard A. Gleixner, North Canton, all of Ohio

[73] Assignee: The Babcock & Wilcox Company, New Orleans, La.

[21] Appl. No.: 921,821

[22] Filed: Jul. 29, 1992

Related U.S. Application Data

[63] Continuation-in-part of Ser. No. 648,461, Jan. 31, 1991, abandoned.

[51] Int. Cl.$^6$ .................................................. B22D 11/01
[52] U.S. Cl. ......................... 505/950; 065/525; 264/14; 425/7; 425/72.2; 425/74; 505/704
[58] Field of Search .................... 65/507, 510, 524, 65/525, 526; 239/290, 300, 432, 434.5; 264/12, 13, 14; 425/6, 7, 72.1, 72.2, 73, 74; 505/704, 950

[56] References Cited

U.S. PATENT DOCUMENTS

| | | | |
|---|---|---|---|
| 3,283,039 | 11/1966 | Walz et al. | 425/7 |
| 3,436,792 | 4/1969 | Hench | 425/7 |
| 4,060,355 | 11/1977 | Walz et al. | 425/7 |
| 4,316,731 | 2/1982 | Lin et al. | 65/5 |
| 4,494,970 | 1/1985 | Muschelknautz et al. | 65/16 |
| 4,539,029 | 9/1985 | Muschelknautz et al. | 65/5 |
| 4,676,815 | 6/1987 | Wagner et al. | 65/16 |
| 4,698,086 | 10/1987 | Fachat et al. | 65/16 |
| 4,828,469 | 5/1989 | Right | 425/7 |
| 4,961,695 | 10/1990 | Hirschmann et al. | 65/5 |
| 5,075,161 | 12/1991 | Nyssen et al. | 264/14 |
| 5,163,620 | 11/1992 | Righi | 239/290 |
| 5,171,489 | 12/1992 | Hirao et al. | 264/12 |

*Primary Examiner*—C. Scott Bushey
*Attorney, Agent, or Firm*—Daniel S. Kalka; Robert J. Edwards

[57] ABSTRACT

An improved method and apparatus for producing flexible fibers (30) of superconducting material includes a crucible (12) for containing a charge of the superconducting material. The material is melted in the crucible (12) and falls in a stream (18) through a bottom hole (16) in the crucible (12). The stream (18) falls through a protecting collar (22) which maintains the stream (18) at high temperatures. The stream (18) is then supplied through a downwardly directed nozzle (26) where it is subjected to a high velocity of a heated gas (36') which breaks the melted superconducting material into ligaments which solidify into the flexible fibers (30). The fibers (30) are collected by directing them against a collection filter (32).

8 Claims, 7 Drawing Sheets

FLOW DIRECTION →

1 Bag    2 Bag-Jet    3 Transition    4 Ligament

Fibers Produced with 260°C Air (500X).

Fibers Produced With Ambient Air (500X).

Fibers Made With Argon Gas

Fibers Made with Helium Gas

SUPERCONDUCTOR FIBER ELONGATION WITH A HEATED INJECTED GAS

This application is a continuation-in-part of U.S. patent application Ser. No. 07/648,461, filed Jan. 31, 1991, now abandoned.

This invention was made with Government support under a contract with the Department of Energy (DOE) and Ames Laboratory, Contract No. SC-91-225, our reference number CRD-1272. The Government has certain rights in this invention.

BACKGROUND OF THE INVENTION

1. Field of the Invention

The present invention relates in general to superconducting material, and in particular to a new and improved method and apparatus of producing elongated flexible fibers from such material.

2. Description of the Related Art

U.S. Pat. Nos. 4,299,861 and 4,078,747 produce flexible superconductor fibers by providing a superconducting layer on a carbon fiber. U.S. Pat. No. 4,861,751 is similar in that the superconductor is formed as a sheath of superconducting oxide exterior to a core of amorphous metal alloy. U.S. Pat. No. 3,951,870 also relates to preparing a flexible superconductor fiber by the chemical conversion of a precursor carbon fiber by the high temperature reaction of a carbon yarn with a transition metal such as $NbCl_5$, $H_2$, $N_2$. U.S. Pat. No. 4,378,330 discloses a process for preparing a composite superconducting wire to form a plurality of very fine ductile superconductors in a ductile copper matrix. U.S. Pat. No. 4,939,308 discloses an electrodeposition method for forming a superconducting ceramic. U.S. Pat. No. 4,866,031 discloses a process for making 90° K. superconductors from acetate precursor solutions.

None of these references, however, addresses the problem of fiber brittleness where the fiber is of superconducting material only.

U.S. Pat. No. 4,828,469, which is owned by the assignee of the present application, discloses an improved nozzle for the production of alumina-silica ceramic fibers. The fibers from superconducting material produced with this nozzle are extremely brittle.

Also, see the article entitled "Preparation of Superconducting Bi-Sr-Ca-Cu-O Fibers" by LeBeau, et al., *Appl. Phys. Lett.*, 55 (3) 17 Jul. 1989, which discloses long slender fibers of superconducting Bi compounds but which lacks the specific disclosure of the present application for creating these fibers.

Major advances have been made in the development of high-temperature superconductor (HTSC) materials based on copper-bearing oxides such as $Y_1Ba_2Cu_3O_7$ and $Bi_2Sr_2Ca_1Cu_2O_x$. These and other raw materials have been processed using a wide variety of techniques in an attempt to produce useful engineering devices. Some of the processing techniques used include plasma spraying, sputtering, sol-gel, laser pedestal growth, wire and strip manufacturing and fiberization. In the plasma spraying and sputtering methods, the HTSC material is deposited on a substrate to produce a thin film. In the laser-heated pedestal growth method, the HTSC powder is pressed into pellets and sintered and small rods are cut from the pellets. A laser is used to melt the top of the rod and a seed crystal is placed in the melt. The wire is grown by withdrawing the seed at a controlled rate between 1.5 and 50 mm/hr. This method is extremely slow and therefore does not lend itself to becoming a good technique for mass production.

In the fiberization method, Bismuth based compounds were melted and fiberized using a gas jet. Fibers typically 100 µm to 200 µm in diameter and 5 mm to 10 mm in length were produced using the nozzle from U.S. Pat. No. 4,828, 469. The fibers were very brittle and did not have a large length-to-diameter ratio, however. Small pieces of thin film, strip, tape and wire have been produced from the superconducting materials.

With the development of gas fiberization techniques by The Babcock & Wilcox Company, the preparation of the high temperature superconductor $Bi_2Sr_2Ca_1Cu_2O_8$ from the melt became possible. The advantage of such an approach over commonly utilized powder sintering processes is that the material produced is (for practical purposes) amorphous with excellent ductility. Transformation of the amorphous product by crystallization via thermal treatment can be achieved reliably. Also, much higher densities than can be achieved from conventional processing are observed for the fiber material. A higher integrity structure with better current transport properties can be manufactured from such a starting stock material.

It is desirable with such a gas fiberization technique to complete the transformation of the molten droplet to a completely full length fiber by allowing the feeder ball droplet to stay molten until complete fiber transformation is completed.

SUMMARY OF THE INVENTION

The present invention solves the aforementioned problem as well as others by providing a heater which provides heated gas into the primary gas side of the fiberization nozzle. The gas temperature is adjusted to match the type of material intended to be fiberized.

One object of the present invention is to provide high-temperature superconductor (HTSC) fibers with better mechanical properties (flexibility) than currently available. The flexibility makes these fibers more useful in producing multi-filamentary superconducting composite wires which can be used in many commercial applications. The composite superconducting wires require fibers with diameters on the order of a few microns and length-to-diameter ratios in the range of 1,000 to 10,000. The fine fibers produced from HTSC materials are incorporated into a normal metal matrix to form the composite multi-filamentary conductor. Davidson, Tinkham and Beasley (IEEE Trans. Magn. MAG-11, 276, 1975) have shown that the effective conductivity of such a superconductor-normal metal composite is increased over the normal metal conductivity by the square of the length-to-diameter ratio of the fibers, $[\sigma \sim 1/d^2]$. This means that a composite of superconducting filaments 1 cm long and 10 cm in diameter embedded in a copper matrix will give a conductivity one million times greater than that of copper alone. If, in addition, there is a significant proximity effect, in which superconductivity is induced in the copper matrix, true supercurrents will flow. The goal here is to develop a process for preparation of long slender fibers of the high temperature superconductors for use in those composites.

Accordingly, another object of the present invention is to provide a method of producing flexible fibers of superconducting material, comprising: melting a superconducting material; dropping a stream of the melted superconducting material into a vertically extending barrel; blowing a heated gas downwardly through the barrel at a sufficient rate to transform the melted superconducting material in the barrel.

into fine ligaments which form flexible fibers; and collecting the flexible fibers.

A further object of the present invention is to provide an apparatus for producing flexible fibers of superconducting material which comprises a heater providing heated gas into the primary gas side of a nozzle of special construction and design which has been found to be critical for producing the flexible superconducting fibers.

Still a further object of the present invention is to provide a method and apparatus which completes the transformation of a molten droplet in a gas fiberization technique to a completely full length fiber by allowing the feeder ball droplet to stay molten until complete fiber transformation is completed.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which the preferred embodiments of the invention are illustrated.

DESCRIPTION OF THE PREFERRED EMBODIMENTS

Figure 1:
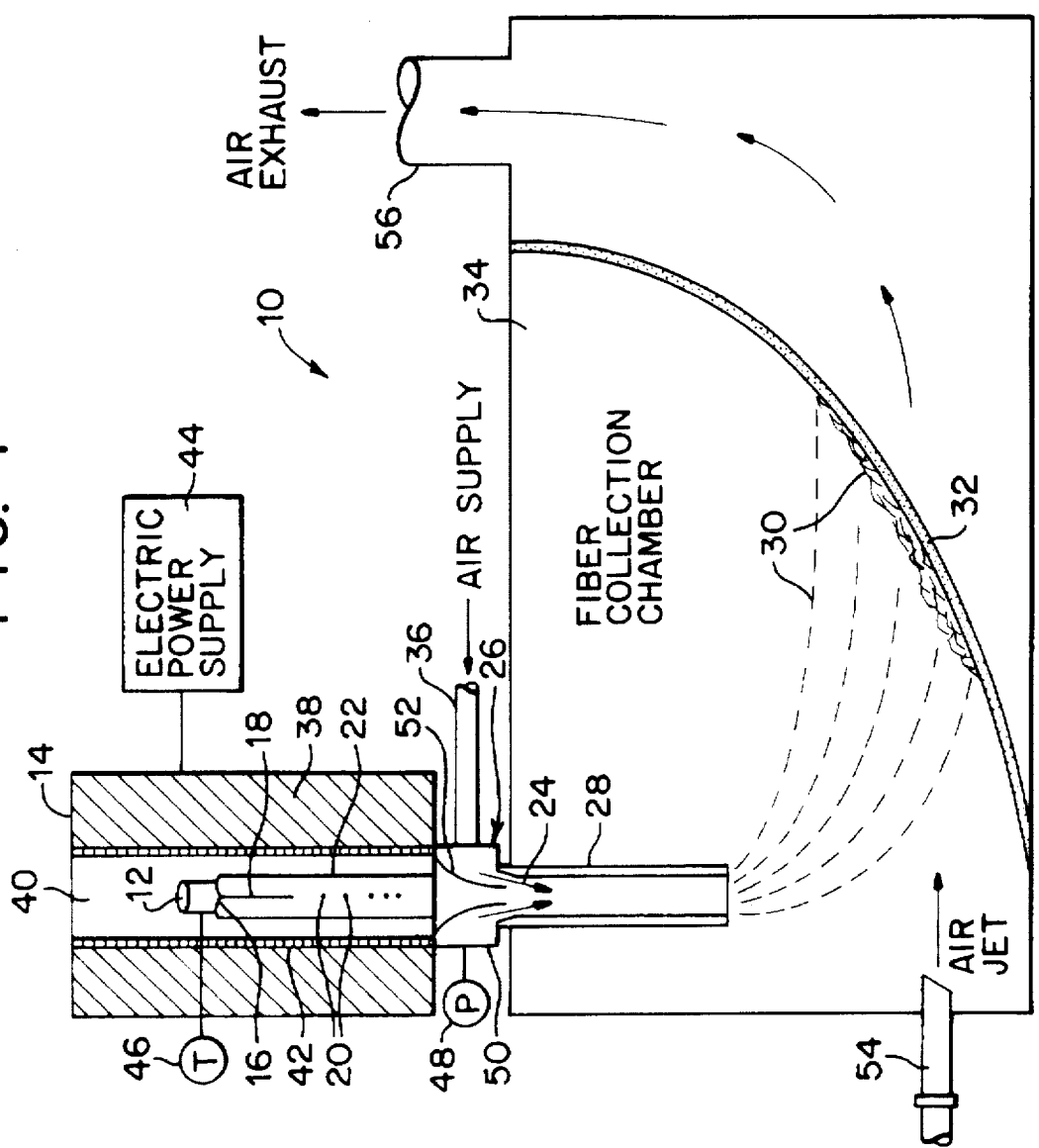
FIG. 1 is a schematic sectional view of an apparatus constructed in accordance with the present invention, for practicing the method of the present invention.

Referring to the drawings in particular, one embodiment of the invention shown in FIG. 1 comprises an apparatus generally designated (10) of producing a flexible fibers of superconductor material (30), in accordance with the method of the prevent invention.

$Bi_2Sr_2Ca_1Cu_2O_x$ (Bi 2212) high-temperature superconducting material in powder or pellet form is melted in an alumina crucible (12) using an electric furnace (14) of the apparatus (10).

High temperature superconductor (HTSC) precursor powders which are blended, calcined and annealed by external vendors are melted in an alumina crucible utilizing an electric resistance furnace. The powder is compacted and added in pelletized form. The pellets are charged directly into a preheated crucible assembly to minimize the occurrence of possible deleterious chemical reactions between the charge material and crucible or loss of alloying constituents. An inert gas such as argon protects the molten bath from reaction with oxygen which maintains melt purity. The material is melted and heated sufficiently to insure that the melt is of uniform temperature prior to fiberization.

Figure 9:
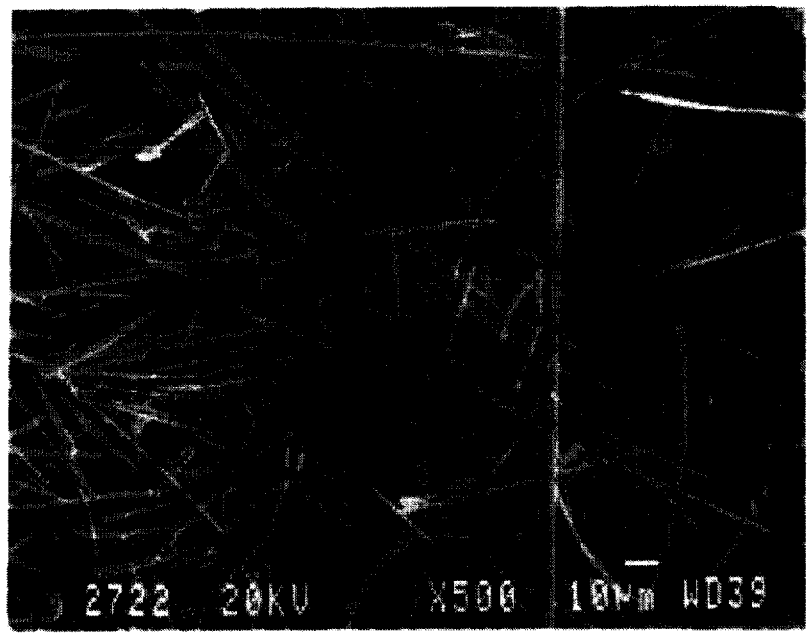
FIG. 9 is a photomicrograph of fibers made with argon gas.
Figure 10:
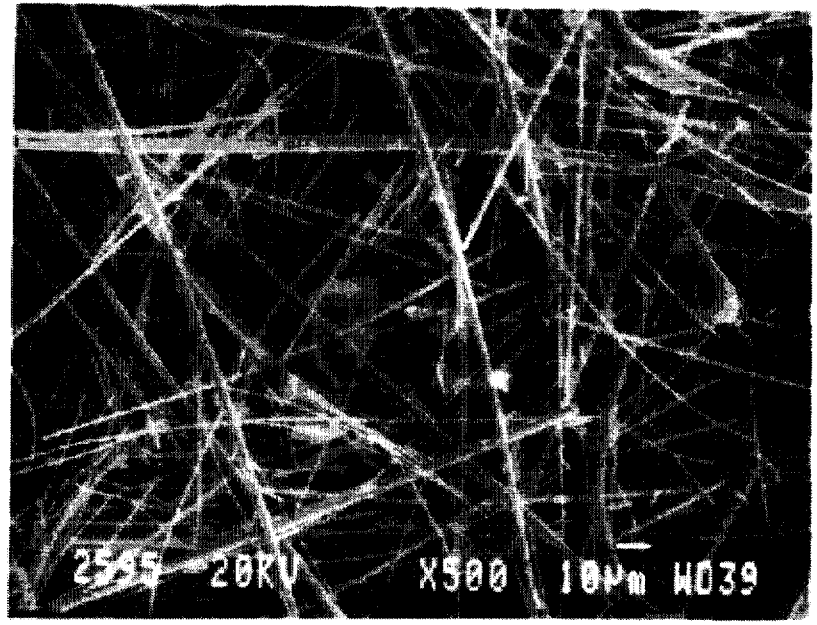
FIG. 10 is a photomicrograph of fibers made with helium gas.

The Bi 2212 melts completely at 1650° F. (phase change). The melt, however, is superheated to 1720° F.–1740° F. to reduce its viscosity. Once the melt is well established, it flows freely at (18) from a small hole (16) at the bottom of the alumina crucible (12). The melt forms a continuous stream which might break up into separate droplets at (20). The melt falls through a high-temperature ceramic collar (22) in the furnace, which is used to stabilize the melt stream and prevent it from wavering. The molten stream is then subjected to a high velocity fiberizing gas stream (24) inside a blowing nozzle (26) mounted in the vertical direction. The high velocity gas generates enormous shearing rates on the surface of the molten stream which transform the Bi 2212 melt into fine ligaments. The ligaments in the molten/glassy state undergo further shearing and cooling inside a barrel (28) of the nozzle (26). The filaments become long and thin and reach complete solidification producing fibers (30). Some of the melt produces small flakes and nearly spherical shot. The blown material is collected downstream on a porous cloth (32) in a vented collecting chamber (34). The blowing nozzle (26) is a modification of the nozzle in U.S. Pat. No. 4,828,469. The modified nozzle is here designed specifically to accommodate the thermal and fluid characteristics of the Bismuth-based superconductor melts; namely, to match the viscous behavior and cooling characteristics of these melts. Furthermore, the new nozzle is designed to bring the high velocity shear layer in close proximity of the droplets so that fine fibers are stripped from the melted superconducting material. The objective of the modified nozzle is to obtain thin fibers with length-to-diameter ratios in the range of 1,000 to 10,000. The produced fiber is very flexible and ranges in diameter from 1 to 10 microns (µm) with lengths of about 25 to 50 millimeters. The nozzle is operated at supersonic speeds and with a gas supply (36) of air sufficient to produce pressures between 10 and 20 psig for best results. Of course other gases may be employed, for example, steam, argon, nitrogen or helium. FIGS. 9 and 10 show the effect various gases have on the fiberization process. FIG. 10 shows how helium gas makes better fibers with less waste than argon gas.

The present invention addresses one of the major obstacles facing the development of high-temperature superconductors; namely, the problem of brittleness. Most of the materials produced from HTSC powders exhibit poor mechanical properties and therefore cannot be used reliably in commercially-useful devices. In addition, these materials have only been produced in simple shapes, such as small pieces of wire, tape and thin film and methods of mass production are still lacking. The flexible fibers of the invention can reliably be made on a mass production basis using the gas jet blowing technique.

The major advantages of the present invention are that: the fibers formed from the HTSC material are very flexible which permits the formation of rope and other forms of fiber bundles which can be flexibly shaped into useful applications, such as for motors, generators, transformers, magnets, power lines, levitated trains and medical imaging systems.

Long slender fibers are an attractive shape for a superconducting material because they can be combined into a superconducting-normal metal composite having an enormous overlap area for current transfer between fibers. Also the 1–10 micron (μm) diameters and length-to-diameter ratios of 1,000 to 10,000 of these fibers are ideal for the development of multi-filamentary superconducting wire.

Although the present invention has been described in terms of Bismuth 2212 HTSC material, fibers can also be produced from the Bismuth 1112, lead-bearing Bismuth compounds and other non-bismuth-based materials. Newly-developed and existing superconducting material could also be suitable candidates for the production of flexible fibers as long as they possess the appropriate thermal and fluid properties for good fiberization.

Returning now to FIG. 1, the apparatus (10) includes an insulated sleeve of high temperature refractory material (38) which contains a central passage (40) in which the crucible (12) and collar (22) are positioned. This chamber is surrounded by a heating coil (42) which is connected to an electric power supply (44), for heating the crucible and collar to the melting temperature of the material in the crucible and above. An inert gas such as argon is supplied to the crucible to protect the molten bath from reaction with oxygen. This maintains the melt purity.

A temperature sensor (46) is advantageously connected to the crucible (22) for sensing the temperature of the crucible, and a pressure sensor (48) is connected to an inlet chamber (50) of the nozzle (26). A converging deflector or disc (52) is positioned within inlet chamber (50) for deflecting the air supply (36) downwardly in the direction of flow (24), for transforming the stream droplets (20) into ligaments which solidify in the barrel (28) and form fibers (30). While air is used for the fiberizing gas in this example, it is understood that other suitable fiberizing gases include and are not limited to steam, nitrogen, argon, helium, or any mixture thereof.

A collecting air or gas supply line (54) also directs air or other gas against the collecting cloth (32). This air is vented from the collecting chamber (34) through an exhaust (56).

In practicing the present invention, it was found that the temperature of the superconducting material in the crucible must be raised up to 100° above its melting point to ensure that the melt is sufficiently fluid to flow through the opening in the crucible (12). Only after the higher temperature range was reached, was a plug (not shown) in the opening (16) removed to initiate the stream (18).

It was also important to investigate droplet formation. There are several distinct mechanisms for droplet breakup depending on the value of the Weber number (We) and LaPlace number (La) which are expressed by 1) $We=(\rho_a U^2 D)/\sigma$
2) $1/La=\mu^2/\sigma\rho D$ $\rho_a$ is the air density, U is the local air velocity, σ (sigma) is surface tension, ρ is melt density, μ is melt viscosity and D is the diameter of the undisturbed droplet. The Weber number is the ratio of the aerodynamic force to the droplet surface tension and the inverse LaPlace number is the ratio of the viscous force to the surface tension force on the droplet.

Figure 2:
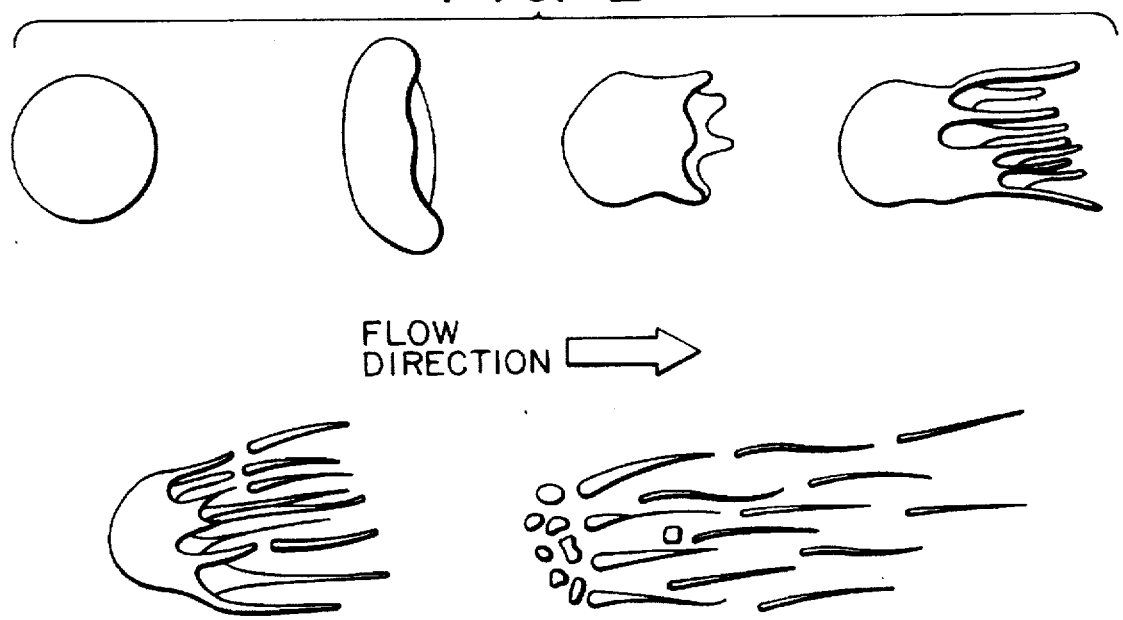
FIG. 2 is a time elapse, composite view of how a droplet deforms under the influence of the gas stream in a barrel of the blowing nozzle.
Figure 3:
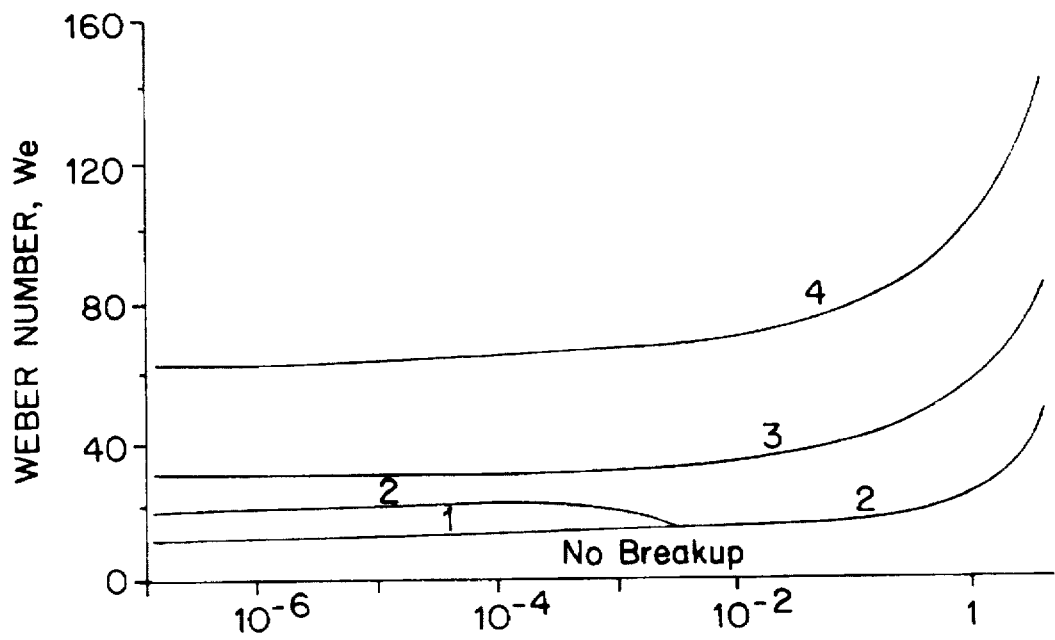
FIG. 3 is a graph plotting, the inverse of the LaPlace number against the Weber number for droplet breakup mechanisms.

The manner in which liquid droplets disintegrate is found to depend on the range of the Weber number as shown in FIG. 3. For Weber numbers under about 10 there is no breakup; between about 10 and 25 there is a bag mode; between 25 and 50 there is an umbrella mode; between 50 and about 1000 there is a stripping of ligaments from the periphery of the deformed droplet; above 1000, atomization begins. Ligament type breakup is desirable for fiber production because it yields more fibers and less shot. FIG. 2 shows the ligament mode breakup. For this reason, the liquid does not solidify until the last stage where filaments and shot of the high temperature superconductor are formed. For 1/La less than 0.01, ligament formation and fiberization requires a Weber number in the range of 70, and the effect of the LaPlace number was found experimentally to be small as shown in FIG. 3. For inverse Laplace numbers greater than 0.01, the Weber number must be somewhat larger to achieve fiberization.

According to the invention, in addition to reducing the viscosity of the melted superconducting material, down to about 1 poise at the superheated level, it is also important to utilize a nozzle (26) of particular dimensions and design which have been found to be critical.

Figure 4:
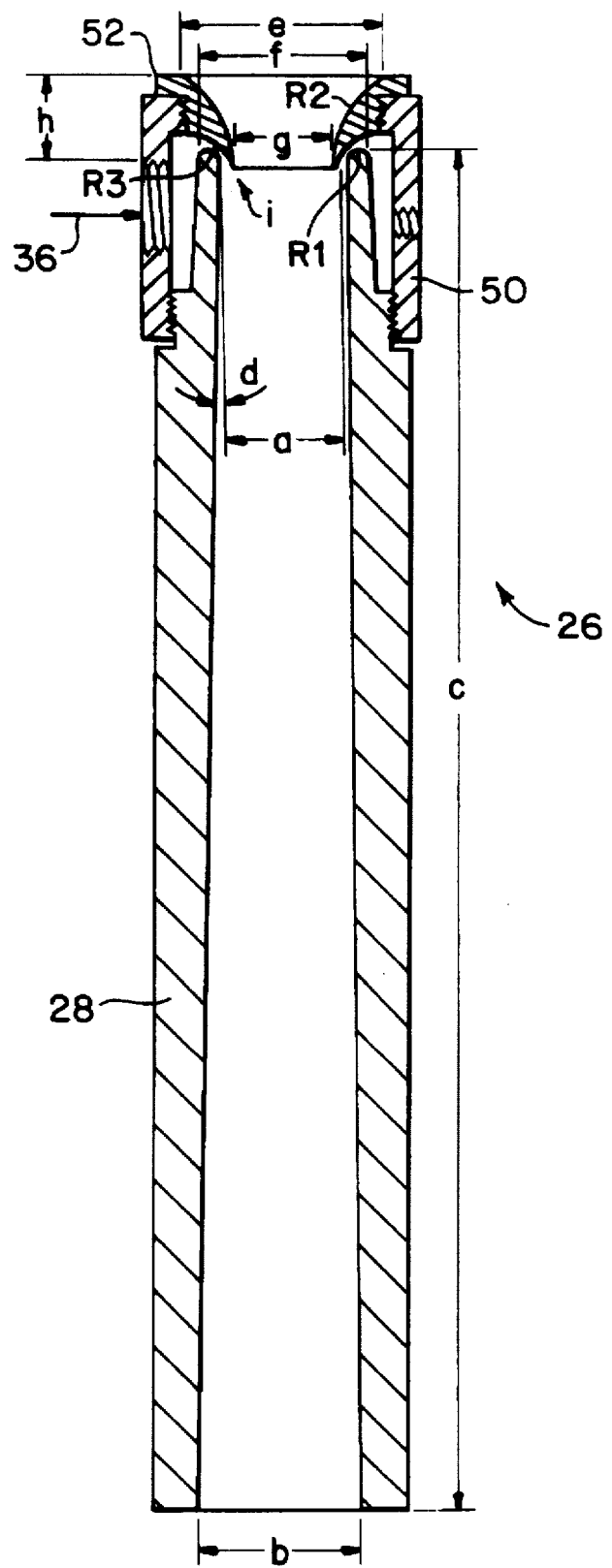
FIG. 4 is a sectional view of the nozzle constructed in accordance with the present invention.
Figure 5:
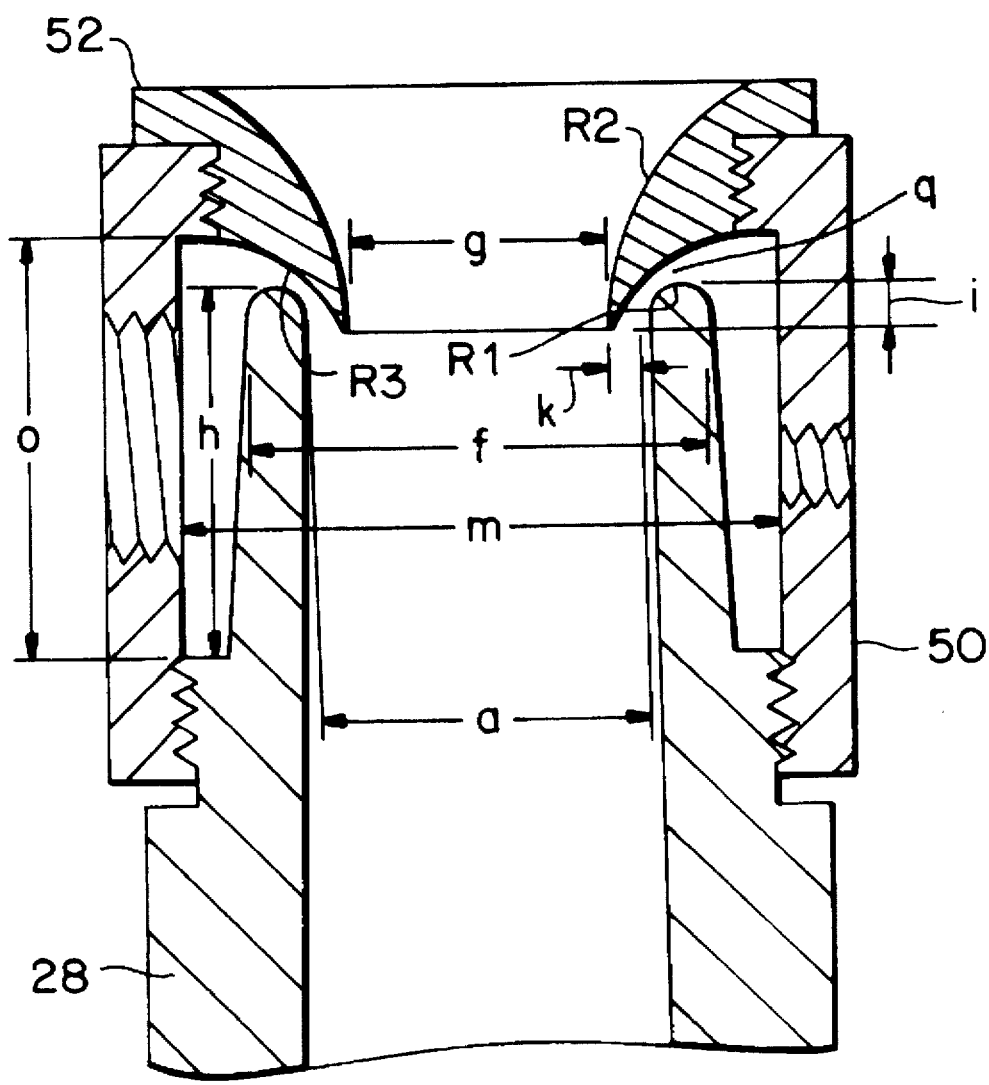
FIG. 5 is a partial sectional view of the nozzle, on an enlarged scale.

Referring now to FIGS. 4 and 5, nozzle (26) is structurally similar to the nozzle disclosed in U.S. Pat. No. 4,828,469, which was mentioned above, however a careful selection of the relative dimensions and positions for the elements of the nozzle are critical to forming superconducting fibers that are flexible and which also have the desired length-to-diameter ratio. The nozzle is designed specifically to accommodate the thermal and fluid characteristics of the Bismuth-based superconductor melts, namely to match the viscous behavior and cooling characteristic of these metals. The Bismuth-based and other high temperature superconductor material have a relatively narrow fiberization temperature window due to the sharp change of melt viscosity with temperature compared to glasses and alumina-silica melts. Therefore, the nozzle of the present invention is placed in the vertical direction immediately beneath the furnace to prevent the melt stream/droplets from cooling before they reach the blowing nozzle (26).

Furthermore, the nozzle of the present invention is designed to bring the high velocity shear layer of air in close proximity to the droplets so that fine fibers are stripped from the melted superconducting material as illustrated in FIG. 2.

Returning now to FIGS. 4 and 5, the various dimensions which are illustrated in the Figures have been found to have the following optimum values, for making flexible fibers of superconducting material having the desired characteristics set forth in this disclosure:

| | |
|---|---|
| Barrel inside inlet diameter | a = 1.25" |
| Barrel inside outlet diameter | b = 1.60" |
| Barrel length | c = 13.80" |
| Barrel bore taper angle | d = 0.73" |
| Disc inside inlet diameter | e = 2.00" |
| Barrel outside inlet diameter | f = 1.61" |
| Disc inside outlet diameter | g = 1.102" |
| Disc axial length | h = 0.844" |
| Disc minimum annular outlet thickness | i = 0.040" |
| Axial overlap between disc and barrel | j = 0.140" |
| Radial annular gap between disc outlet and barrel | k = 0.034" |
| Air chamber inside diameter | m = 2.09" |
| Axial length of barrel in air chamber | n = 1.67" |
| Chamber axial length | o = 1.82" |
| Minimum annular gap between disc and barrel | q = 0.02" |
| Radius of barrel inlet end | R1 = 0.09" |
| Disc inlet passage radius | R2 = 1.50" |
| Disc outside radius | R3 = 0.344" |

Of these measurements, the most critical is the minimum annular gap q of about 0.02" which has been found to be particularly instrumental in achieving the fibers of the desired characteristics. The other dimensions are also important.

Figure 6:
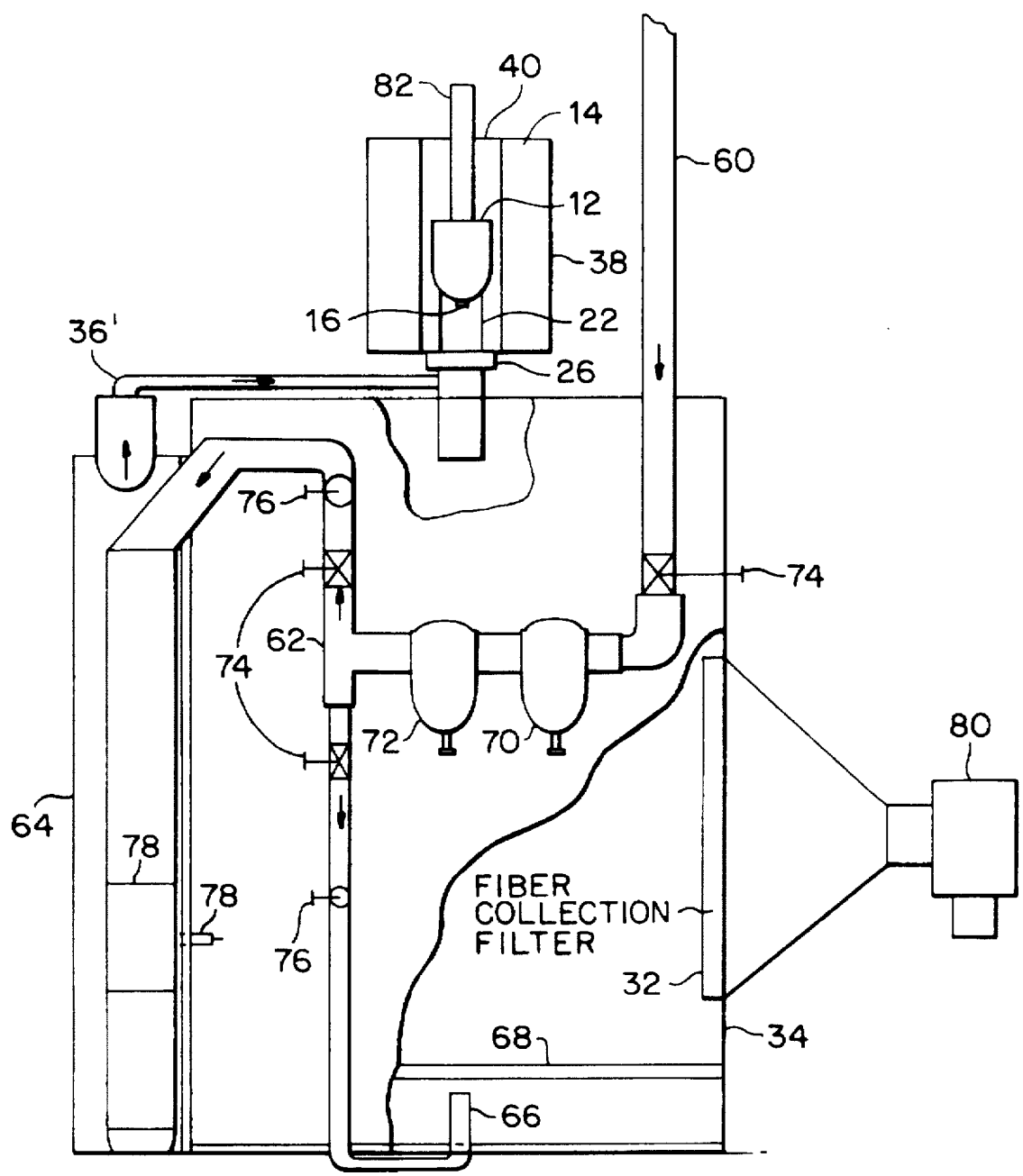
FIG. 6 is a schematic view with portions removed of the preferred embodiment in accordance with the present invention for practicing the method of the present invention.

Next, referring to FIG. 6, there is shown another embodiment of the present invention which is similar to the embodiment depicted in FIG. 1 with the following modifications. An inert gas line (82) connected to a supply (not shown) provides an overpressure of a gas like argon to protect the molten bath of superconducting material from reaction with oxygen. A pipe (60) attached to a supply of gas (not shown) is connected by way of a T connector (62) to heater (64) situated at one side of the collecting chamber (34) and to a secondary gas supply nozzle (66). Nozzle (26) is connected to the heater outlet via line (36') so that the nozzle (26) is supplied with the heated gas. The heater (64) should be capable of heating a gas in a temperature range from between 150° F. to 750° F. As mentioned earlier, suitable gases include air, steam, nitrogen, argon or helium.

Gas at ambient temperature may be optionally directed opposite nozzle (26) to provide a gas cushion at the bottom of collecting chamber (34). A fine mesh screen (68) is positioned across the bottom of collecting chamber (34) to assist in the fiber collecting process and to prevent any debris from blocking secondary nozzle (66).

The secondary gas supply nozzle (66) assists the fiber collecting process by blowing the completed fibers up and away from the products of incomplete transformation which include spherical shot particles and flakes which are collected on screen (68) for recycling and/or disposal. Alternately, the bottom of collecting chamber (34) may be hopper-shaped to facilitate collecting and recycling the products of incomplete transformation.

Similarly, a fan (80) may be employed to direct or pull the discharged fibers to the collecting filter (32). In this manner, a costly fiberizing gas such as helium may be recycled after the discharged fibers are removed by the collecting filter (32).

A moisture trap (70) and oil filter (72) are preferably positioned in the pipe (60) outside the collecting chamber (34) to remove contaminants from the gas supply. Gate valves (74) and regulators (76) in pipe (60) are employed for isolating and regulating the heated gas system from the ambient gas system. A flow meter (78) may be utilized for accurately measuring the gas flow.

The initial step of the fiberization process involves having a gas such as air flow going through the circulation heater (64) at about 100 standard cubic feet per minute (SCFM). The electric heaters are then energized and the outlet air temperature is adjusted to match the type of material that one intends to fiberize. The temperature range can fall between 150° F. to 750° F. Once the heater (64) has achieved steady state, the load is charged into the crucible (12) above the nozzle (26). Within a few minutes, molten droplets (20) exit the bottom of the crucible (12) through the crucible tap hole (16) and enter the top of the fiberization nozzle (26) where the droplet is passed through the high velocity heated air stream.

Figure 7:
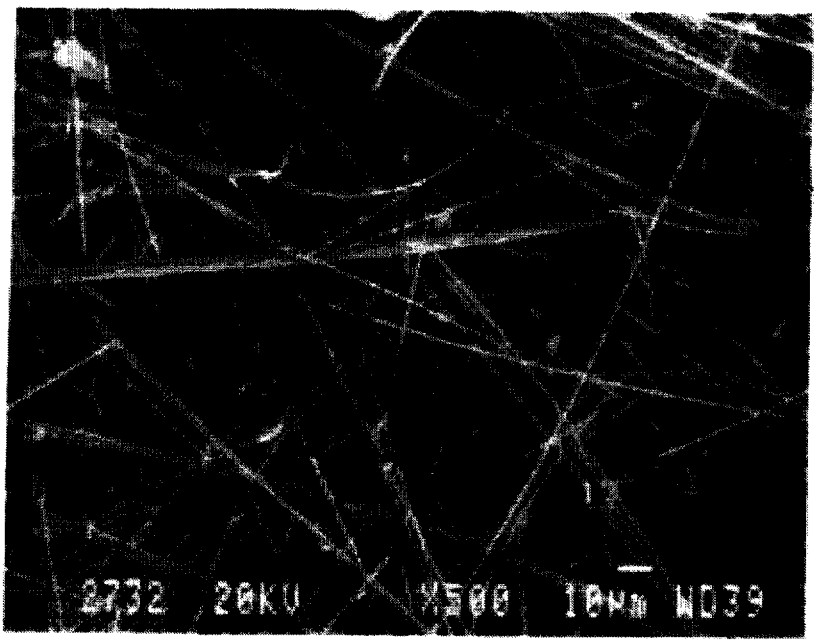
FIG. 7 is a photomicrograph of fibers produced with heated fiberization air.
Figure 8:
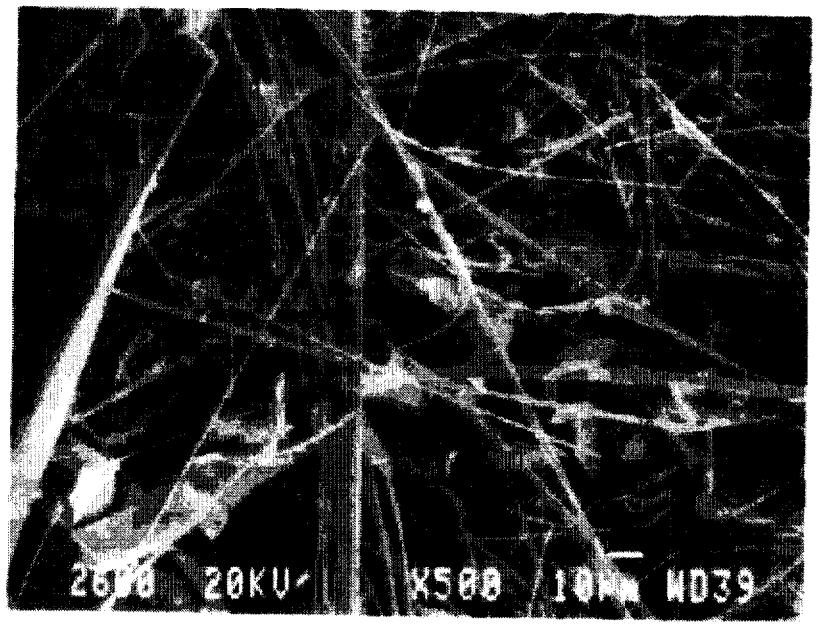
FIG. 8 is a photomicrograph of fibers produced with ambient air.

As evidenced by FIGS. 7 and 8, the use of superheated injected gas provides the following advantages over ambient gas. It provides the ability to regulate the primary gas temperature in order to match up with a specific type of superconducting compound. It reduces the size of droplet feeder balls to a minimum, which in turn increases the quality and quantity of the fiber. Feeder balls are undesirable because they diminish packing density in microfilamentary composites which lower their superconducting performance. It provides the ability to produce flat, thin flake along with the fiber which can be used as a filler between the fiber matrix. It reduces the moisture content in the primary air supply which is harmful to the fiberization process.

Although the heated primary air supply was developed for raising the yield of superconducting fiberization, this heated air is applicable in the manufacturing of ceramic fiber which should also increase the yield of that material.

While a specific embodiment of the invention has been shown and described in detail to illustrate the application of the principles of the invention, it will be understood that the invention may be embodied otherwise without departing from such principles.

What is claimed is:

1. An improved apparatus for producing inorganic fibers, comprising:

a furnace containing a heating space;

a crucible having a hole for discharging a stream of fluid material, said crucible being positioned in the heating space of the furnace;

a nozzle positioned below said crucible for receiving the stream of fluid material and for receiving a primary flow of heated gas for transferring the stream into broken up ligaments, said nozzle having a barrel through which the ligaments fall and solidify into inorganic fibers;

a heater for heating the primary flow of gas supplied directly into said nozzle; and a collection chamber situated to receive the inorganic fibers.

2. An improved apparatus as recited in claim 1, further comprising:

a filter in said collection chamber for gathering the inorganic fibers; and means for directing the inorganic fibers to said filter.

3. An improved apparatus as recited in claim 1, wherein said heater heats the gas to a temperature ranging from between 150° F. to 750° F.

4. An improved apparatus as recited in claim 3, wherein the heated gas is a member selected from the group consisting of air, steam, nitrogen, argon, and helium.

5. An improved apparatus as recited in claim 1, wherein the heated gas is a member selected from the group consisting of nitrogen, helium, and argon.

6. An improved apparatus as recited in claim 1, wherein the heated gas is a member selected from the group consisting of helium and argon.

7. An improved apparatus as recited in claim 2, further comprising means for recycling the heated gas after the inorganic fibers are gathered on said filter.

8. An improved apparatus as recited in claim 1, further comprising means for removing contaminants from gas supplied to said heater.

* * * * *